(12) United States Patent
Yuan et al.

(10) Patent No.: US 10,133,302 B2
(45) Date of Patent: Nov. 20, 2018

(54) CABLE MANAGEMENT DEVICE AND RACK-MOUNTED EQUIPMENT SYSTEM APPLYING CABLE MANAGEMENT DEVICE

(71) Applicant: CELESTICA TECHNOLOGY CONSULTANCY (SHANGHAI) CO. LTD., Shanghai (CN)

(72) Inventors: Ke Yuan, Shanghai (CN); Wenjin Li, Shanghai (CN); Yonghua Wu, Shanghai (CN); Alonzo Ramirez, Merrimack, NH (US)

(73) Assignee: CELESTICA TECHNOLOGY CONSULTANCY (SHANGHAI) CO. LTD., Shanghai (CN)

( * ) Notice: Subject to any disclaimer, the term of this patent is extended or adjusted under 35 U.S.C. 154(b) by 0 days.

(21) Appl. No.: 15/623,347

(22) Filed: Jun. 14, 2017

(65) Prior Publication Data
US 2018/0259999 A1   Sep. 13, 2018

(30) Foreign Application Priority Data

Mar. 8, 2017   (CN) .................. 2017 1 01357522
Mar. 8, 2017   (CN) .................. 2017 2 02206154 U

(51) Int. Cl.
*G06F 1/16*   (2006.01)
*G06F 1/18*   (2006.01)

(52) U.S. Cl.
CPC ............. *G06F 1/16* (2013.01); *G06F 1/182* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,649,415 A * | 7/1997 | Pea | ........................ | F16G 13/16 191/12 C |
| 6,621,692 B1 * | 9/2003 | Johnson | ............... | H05K 7/1421 312/223.1 |
| 8,331,085 B2 * | 12/2012 | Zhang | ..................... | G06F 1/184 174/365 |
| 8,335,076 B2 * | 12/2012 | Zhang | ..................... | G06F 1/184 174/365 |
| 8,373,983 B2 * | 2/2013 | Zhang | ................. | H05K 7/1491 174/542 |
| 8,599,550 B2 * | 12/2013 | Davis | ................... | G11B 33/128 361/679.33 |
| 9,001,514 B2 * | 4/2015 | Rust | ........................ | H05K 7/02 361/727 |
| 2003/0231420 A1 * | 12/2003 | Kano | ................. | G06F 11/3034 360/69 |
| 2006/0290245 A1 * | 12/2006 | Hidaka | ............... | H05K 7/1489 312/223.1 |

(Continued)

*Primary Examiner* — Lisa Lea Edmonds
(74) *Attorney, Agent, or Firm* — Global IP Services; Tianhua Gu

(57) ABSTRACT

Provided is a cable management device and a rack-mounted equipment system applying the cable management device. By putting the entire cable management device on a case instead of behind the case, the length of the entire case is reduced and an entire server or storage can be mounted in a shorter rack. In addition, the cable management device can simultaneously serve upper and lower servers or memories, can also solely serve a lower server or memory, and is flexible and efficient to use.

5 Claims, 4 Drawing Sheets

(56) References Cited

U.S. PATENT DOCUMENTS

| | | | | |
|---|---|---|---|---|
| 2007/0230111 | A1* | 10/2007 | Starr | G11B 33/125 361/679.31 |
| 2010/0123377 | A1* | 5/2010 | Hsu | H05K 7/1491 312/330.1 |
| 2010/0172083 | A1* | 7/2010 | Randall | G11B 33/126 361/679.31 |
| 2010/0172087 | A1* | 7/2010 | Jeffery | G11B 33/02 361/679.33 |
| 2010/0265645 | A1* | 10/2010 | Wang | G06F 1/181 361/679.4 |
| 2012/0050974 | A1* | 3/2012 | Chen | G06F 1/183 361/679.21 |
| 2012/0134095 | A1* | 5/2012 | Zhang | G06F 1/181 361/679.33 |
| 2013/0120927 | A1* | 5/2013 | Wen | G06F 1/187 361/679.39 |
| 2014/0204522 | A1* | 7/2014 | Keffeler | G11B 33/128 361/679.31 |
| 2014/0204525 | A1* | 7/2014 | Pecone | H05K 13/00 361/679.33 |
| 2014/0293523 | A1* | 10/2014 | Jau | H05K 7/1492 361/679.4 |

* cited by examiner

CABLE MANAGEMENT DEVICE AND RACK-MOUNTED EQUIPMENT SYSTEM APPLYING CABLE MANAGEMENT DEVICE

CROSS REFERENCE TO RELATED PATENT APPLICATION

The present application claims the priorities of the Chinese patent applications No. 2017101357522 filed on Mar. 8, 2017 and No. 2017202206154 filed on Mar. 8, 2017, which applications are incorporated herein by reference.

FIELD OF INVENTION

The present invention relates to a rack-mounted equipment, in particular to a cable management device and a rack-mounted equipment system applying the cable management device.

DESCRIPTION OF RELATED ARTS

A server or storage needs to be pulled out for a certain distance from a rack which is used for storing the server or storage during maintenance. In order to guarantee the server or memory is maintained under a situation of no power outage, power lines and signal lines at a rear end will move with the server or storage when the server or memory is pulled out. In order to guarantee that these cables smoothly move without being interfered, a special cable management system (Cable Management Arm, CMA) is needed. The existing cable management system cannot be adjustably mounted according to the length of a rack, and one CMA can serve one memory only.

SUMMARY OF THE PRESENT INVENTION

In view of the above-mentioned disadvantages of the prior art, the purpose of the present invention is to provide a cable management device and a rack-mounted equipment system applying the cable management device, which are used for solving the problems that the cable management device cannot be adjustably mounted according to the length of a rack and one CMA can serve one memory only in the prior art.

In order to realize the above-mentioned purpose and other relevant purposes, the present invention provides a cable management device applied to a rack-mounted equipment system comprising an electronic equipment and a rack, wherein the rack has an equipment holding space for holding the electronic equipment, and the electronic equipment is withdrawable along sidewalls of the rack; the cable management device comprises a supporting body, a fixing body and a holding body; the supporting body comprises a first supporting body which is used for fixing with the rack and has a supporting surface used for supporting the holding body; the fixing body is used for fixing with the electronic equipment and moves with the electronic equipment; the holding body comprises a first flexible body having a first end and a second end, the first end of the first flexible body is fixed with the first supporting body, the second end is fixed with the fixing body and the first flexible body is bent to an arc shape to form a holding space used for holding a cable; and when the second end of the first flexible body moves with the fixing body, the first flexible body is fit with or deviated from the supporting surface of the first supporting body.

In one specific embodiment of the present invention, the first supporting body is a sliding rail; and the first flexible body is a drag chain which is capable of being fit with the sliding rail and consists of a plurality of drag chain units.

In one specific embodiment of the present invention, the supporting body further comprises a second supporting body which is in parallel with the first supporting body, is used for fixing with the rack and has a supporting surface used for supporting the holding body; and the holding body further comprises a second flexible body having a first end and a second end, the first end of the second flexible body is fixed with the second supporting body and the second flexible body is bent to an arc shape to form a holding space used for holding a cable.

In one specific embodiment of the present invention, the second supporting body is a sliding rail; and the second flexible body is a drag chain which is capable of being fit with the sliding rail and consists of a plurality of drag chain units.

In one specific embodiment of the present invention, each of the drag chain units comprises a first unit connecting part and a second unit connecting part which are connected with other drag chain units, and a unit holding space is formed between the first unit connecting part and the second connecting part, wherein when the drag chain unit is connected with the other drag chain units, the unit holding space of the drag chain unit is communicated with the unit holding spaces of the other drag chain units, and all drag chain units are rotatably connected with one another.

In one specific embodiment of the present invention, the second end of the second flexible body is fixed with the fixing body, and when the second end of the second flexible body moves with the fixing body, the second flexible body is fit with or deviated from the supporting surface of the second supporting body.

In one specific embodiment of the present invention, the electronic equipment comprises a first electronic equipment and a second electronic equipment, and the fixing body comprises a first fixing body which is used for fixing with an upper surface of the first electronic equipment and a second fixing body which is used for fixing with a lower surface of the second electronic equipment; and the second end of the first flexible body is fixed with the first fixing body and the second end of the second flexible body is fixed with the second fixing body.

In order to realize the above-mentioned purpose and other relevant purposes, the present invention further provides a rack-mounted equipment system, comprising: an electronic equipment, a rack and the above-mentioned cable management device, wherein the rack has equipment holding space for holding the electronic equipment, the electronic equipment is held in the equipment holding space in a withdrawable manner along sidewalls of the rack, and when the electronic equipment is fully held in the rack, a rear end of the electronic equipment is adjacent to a rear end of the rack; the rack comprises two sliding rails which are respectively located on two sides of the electronic equipment and four supporting columns which support the two sliding rails, and the electronic equipment is held in the equipment holding space in a withdrawable manner through the sliding rails; and the cable management device is placed on the electronic equipment, wherein the fixing body is adjacent to a rear end of the electronic equipment and is fixed on an upper surface of the electronic equipment; and two ends of the supporting body are fixed on two of the supporting columns which are connected with the same sliding rail.

In one specific embodiment of the present invention, the electronic equipment is a server or storage.

In order to realize the above-mentioned purpose and other relevant purposes, the present invention further provides a rack-mounted equipment system, comprising: a first electronic equipment, a second electronic equipment located above the first electronic equipment, a rack having equipment holding spaces for holding the first electronic equipment and the second electronic equipment, and the above-mentioned cable management device; the first electronic equipment and the second electronic equipment are held in the equipment holding spaces in a withdrawable manner along sidewalls of the rack, and when the first electronic equipment and the second electronic equipment are fully held in the rack, rear ends of the first electronic equipment and the second electronic equipment are adjacent to a rear end of the rack; the rack comprises two sliding rails which are respectively located on two sides of the first electronic equipment and the second electronic equipment and four supporting columns which support the two sliding rails, and the first electronic equipment and the second electronic equipment are held in the equipment holding spaces in a withdrawable manner through the sliding rail; and the cable management device is located between the first electronic equipment and the second electronic equipment, wherein the first fixing body is adjacent to the rear end of the first electronic equipment and is fixed on an upper surface of the first electronic equipment; the second fixing body is adjacent to the rear end of the second electronic equipment and is fixed on a lower surface of the second electronic equipment; and two ends of the first supporting body and two ends of the second supporting body are respectively fixed on two of the supporting columns which are connected with the same sliding rail.

As described above, in the cable management device and the rack-mounted equipment system applying the cable management device provided by the present invention, by putting the entire cable management device on a case instead of behind the case, the length of the entire case can be reduced and an entire server or storage can be mounted in a shorter rack. In addition, the cable management device in the present invention can simultaneously serve upper and lower servers or storages, can also solely serve a lower server or memory, and is flexible and efficient to use.

DESCRIPTION OF COMPONENT REFERENCE SIGNS

Figure 1:
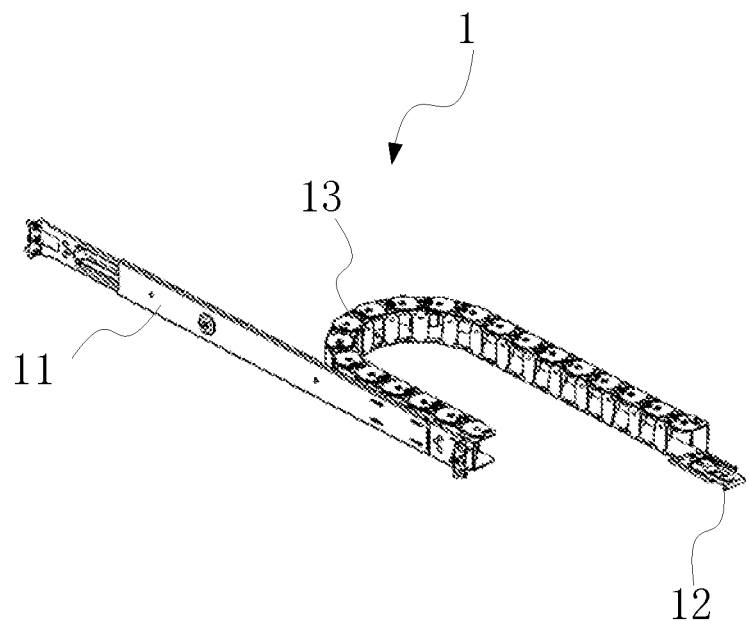
FIG. 1 illustrates a structural schematic view of a sub-assembly which belongs to a cable management device provided by the present invention in one specific embodiment.

1 Cable management device
11 First supporting body
12 Fixing body
13 First flexible body
130 Drag chain unit
131 First unit connecting part
132 Second unit connecting part
133 Unit holding space
14 Second supporting body
15 Second flexible body
16 First fixing body
17 Second fixing body
2 Rack
21 Sliding rail
22 Supporting column
3 Electronic equipment
4 First electronic equipment
5 Second electronic equipment

DETAILED DESCRIPTION OF THE PREFERRED EMBODIMENTS

The implementation modes of the present invention will be described below through specific examples. One skilled in the art can easily understand other advantages and effects of the present invention according to contents disclosed in the description. The present invention may also be implemented or applied through other different specific implementation modes. Various modifications or variations may be made to all details in the description based on different points of view and applications without departing from the spirit of the present invention. It needs to be stated that the following embodiments and the features in the embodiments may be mutually combined under a situation of no conflict.

Please refer to FIG. 1 to FIG. 7. It needs to be stated that the drawings provided in the following embodiments are just used for schematically describing the basic concept of the present invention, thus only illustrate components only related to the present invention and are not drawn according to the numbers, shapes and sizes of components during actual implementation, the configuration, number and scale of each component during actual implementation thereof may be freely changed, and the component layout configuration thereof may be more complex.

Please refer to FIG. 1, which illustrates a structural schematic view of a cable management device 1 provided by the present invention in one specific embodiment. The cable management device 1 is used for managing cables of electronic equipments such as servers or storages. The cable management device 1 is applied to a rack-mounted equipment system comprising an electronic equipment and a rack, wherein the rack has an equipment holding space for holding the electronic equipment, and the electronic equipment is withdrawable along sidewalls of the rack. The electronic equipment is a server or memory. Specifically, the cable management device 1 comprises a supporting body, a fixing body 12 and a holding body. The cable management device 1 in this embodiment will be described below in detail.

In this embodiment, as illustrated in FIG. 1, the supporting body comprises a first supporting body 11 which is used for fixing with the rack and has a supporting surface used for supporting the holding body, the fixing body 12 is used for fixing with the electronic equipment and moves with the electronic equipment, the holding body comprises a first flexible body 13 having a first end and a second end, the first end of the first flexible body 13 is fixed with the first supporting body 11, the second end of the first flexible body 13 is fixed with the fixing body 12 and the first flexible body 13 is bent to an arc shape to form a holding space used for holding a cable; and when the second end of the first flexible body 13 moves with the fixing body, the first flexible body 13 is fit with or deviated from the supporting surface of the first supporting body 11.

Accordingly, it can be seen that the cable management device is fully placed on the electronic equipment instead of behind the electronic equipment, thereby the length of the entire electronic equipment can be reduced and thus the entire server or storage can be mounted in a shorter rack.

Herein, the first supporting body 11 is strip-shaped and the two ends thereof are respectively fixed on the rack. In this embodiment, the first supporting body 11 is preferably a sliding rail, and the first flexible body 13 is preferably a drag chain which is capable of being fit with the sliding rail and consists of a plurality of drag chain units.

Figure 2:
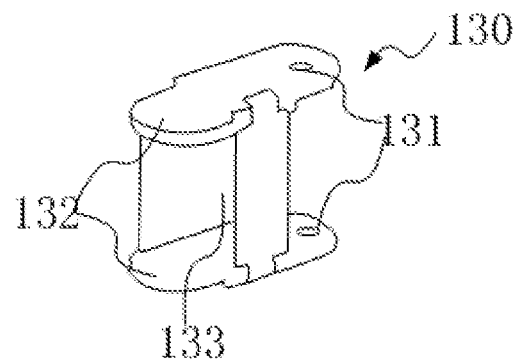
FIG. 2 illustrates a structural schematic view of a single plastic chain body which belongs to a cable management device provided by the present invention in another specific embodiment.

As illustrated in FIG. 2, each of the drag chain units 130 comprises a first unit connecting part 131 and a second unit connecting part 132 which are connected with other drag chain units, and a unit holding space 133 is formed between the first unit connecting part 131 and the second connecting part 132, wherein when the drag chain unit 130 is connected with the other drag chain units 130, the unit holding space 133 of the drag chain unit 130 is communicated with the unit holding spaces 133 of the other drag chain units 130, and all drag chain units 130 are rotatably connected with one another.

By adjusting the number of the drag chain units 130 which form the drag chain, the length of the drag chain can be conveniently adjusted, thereby the demand for pulling out the server or storage for different distances from the rack is satisfied and the demand for flexibly adapting to sizes of different equipment is satisfied.

In this embodiment, the drag chain is made of plastic. By adopting plastic, the weight is light and the cost is low.

It needs to be stated that, in this embodiment, the structure of the drag chain is just an exemplary structure of the first flexible body 13, and the first flexible body 13 may also be a structure which allows cables to penetrate, which has a controllable shape and is similar to the drag chain, e.g., a shape-controllable hose structure.

Figure 3:
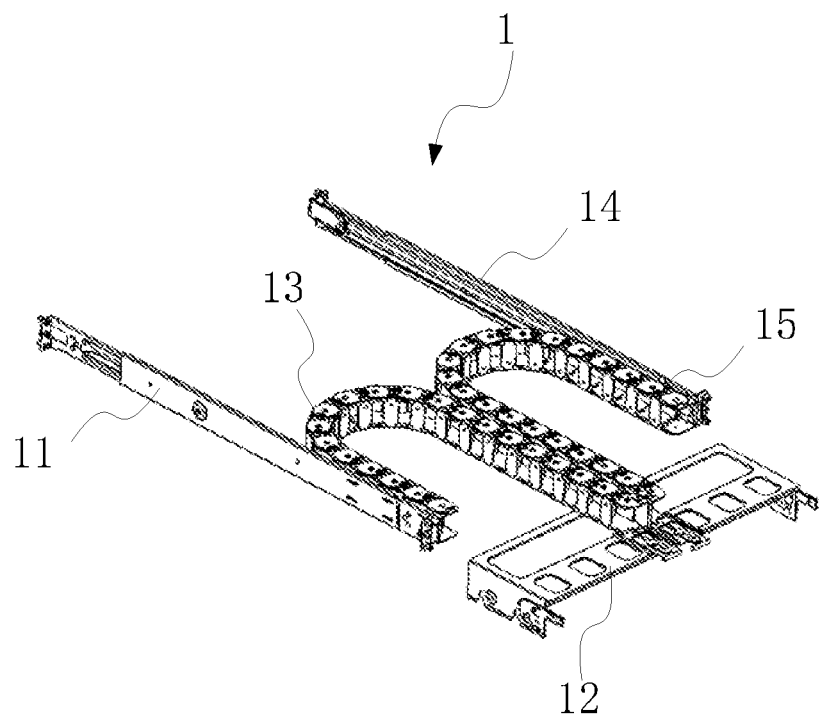
FIG. 3 illustrates a structural schematic view of a cable management device provided by the present invention in one specific embodiment.

In this embodiment, as illustrated in FIG. 3, the supporting body further comprises a second supporting body 14 which is in parallel with the first supporting body 11, is used for fixing with the rack 2 and has a supporting surface used for supporting the holding body; and correspondingly, the holding body further comprises a second flexible body 15 having a first end and a second end, the first end of the second flexible body 15 is fixed with the second supporting body 14 and the second flexible body 15 is bent to an arc shape to form a holding space used for holding cables.

In this embodiment, the second supporting body 14 is strip-shaped, the two ends are respectively fixed on the rack 2 and the second supporting body 14 is preferably a sliding rail; and the second flexible body 15 may be a drag chain which is capable of being fit with the sliding rail and consists of a plurality of drag chain units 130. Herein, the structure of the drag chain of the second flexible body 15 is the same as the structure of the drag chain of the first flexible body 13 and thus is not repetitively described here.

Accordingly, it can be seen that, in this embodiment, the cable management device 1 may has two supporting bodies and two flexible bodies for holding cables. When the electronic equipment is withdrawn along sidewalls of the rack, a fitting mode of the second supporting body 14 and the second flexible body 15 is the same as the fitting mode of the first supporting body 11 and the first flexible body 13.

In this embodiment, when the cable management device 1 has two supporting bodies and two flexible bodies for holding cables, the cable management device 1 can serve one server or storage and can also simultaneously serve two servers or storages.

Figure 4:
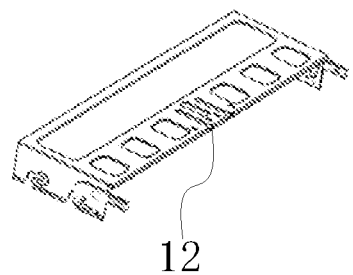
FIG. 4 illustrates a structural schematic view of a fixing body of a cable management device provided by the present invention in one specific embodiment.

In this embodiment, as illustrates in FIG. 4, the fixing body 12 comprises a fixing plate with width which is matched with the width of the electronic equipment and two connecting ends which extend from the two ends of the fixing plates, are perpendicularly bent and are used for being fixed on the electronic equipment. The two connecting ends are connected with the electronic equipment through fixing pieces of two latches or screws.

Figure 5:
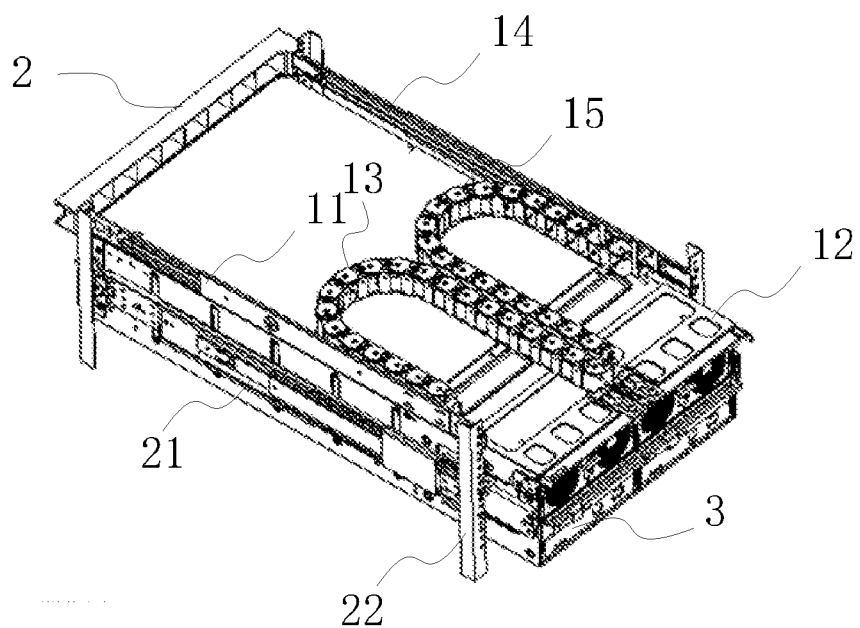
FIG. 5 illustrates a structural schematic view of a rack-mounted equipment system provided by the present invention.
Figure 6:
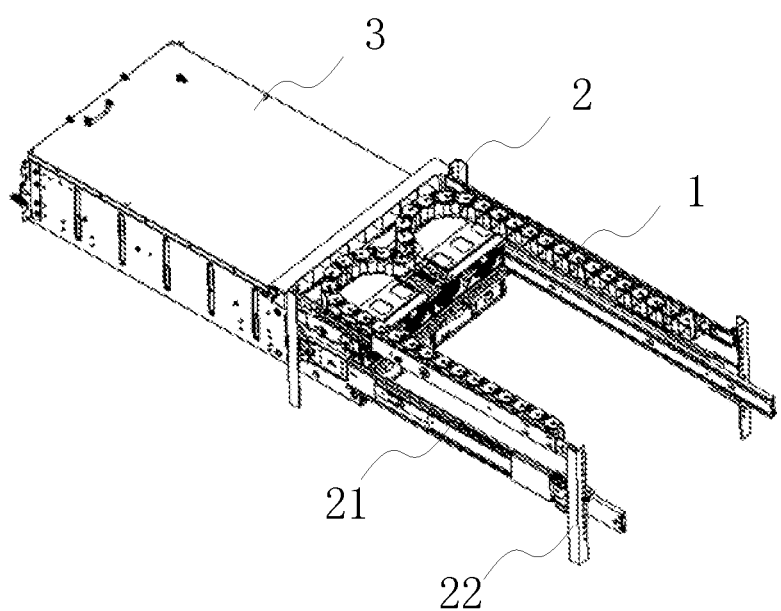
FIG. 6 illustrates a structural schematic view of a rack-mounted equipment system provided by the present invention.

As illustrated in FIG. 5, when the electronic equipment 3 is fully held in the rack 2, a rear end of the electronic equipment 3 is adjacent to a rear end of the rack 2; and when the electronic equipment 3 is withdrawn along sidewalls of the rack 2, the fixing body 12 moves with the electronic equipment 3, the first end of the first flexible body 13 fixed on the fixing body 12 moves with the fixing body 12, the first flexible body 13 is gradually fit along the supporting surface of the first supporting body 11, and the shape of the holding space which is formed by bending the first flexible body 13 to an arc shape and is used for holding the cable gradually changes, as illustrated in FIG. 6.

As illustrated in FIG. 5 and FIG. 6, when the cable management device 1 has two supporting bodies and two flexible bodies for holding cables and serves one server or storage the second end of the second flexible body 15 is fixed with the fixing body 12; and when the second end of the second flexible body 15 moves with the fixing body, the second flexible body 15 is fit with or deviated from the second supporting surface.

Figure 7:
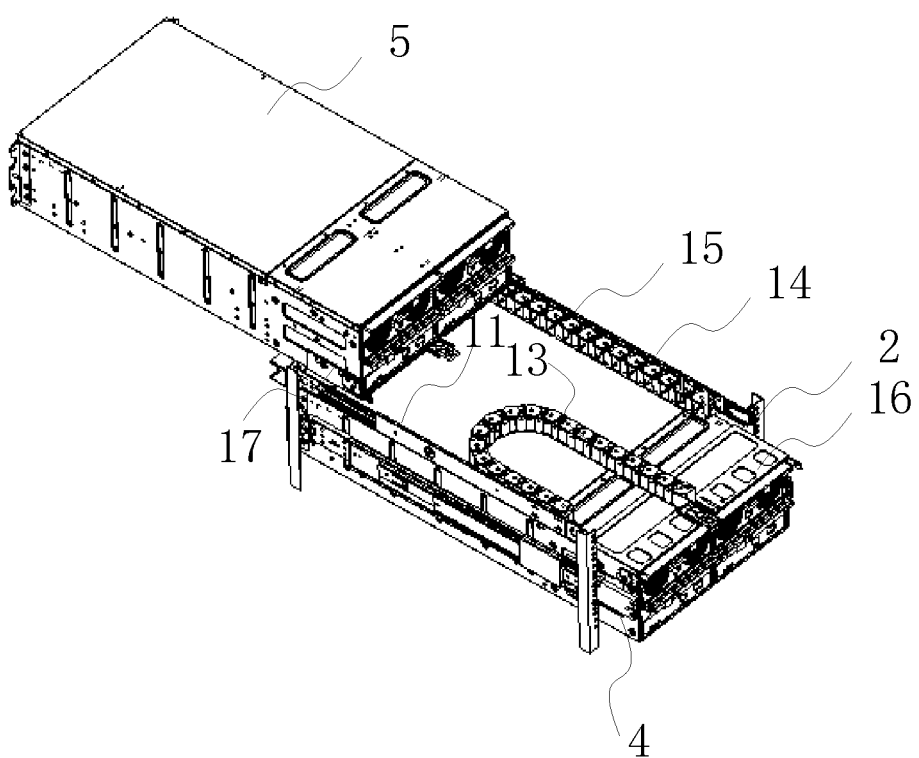
FIG. 7 illustrates a structural schematic view of a rack-mounted equipment system provided by the present invention.

As illustrated in FIG. 7, when the cable management device 1 has two supporting bodies and two flexible bodies for holding cables and simultaneously serves two servers or storages, the electronic equipment 3 comprises a first electronic equipment 4 and a second electronic equipment 5, and the fixing body 12 comprises a first fixing body 16 which is used for fixing with an upper surface of the first electronic equipment 4 and a second fixing body 17 which is used for fixing with a lower surface of the second electronic equipment 5; and the second end of the first flexible body 13 is fixed with the first fixing body 16 and the second end of the second flexible body 15 is fixed with the second fixing body 17.

For example, the first electronic equipment 4 is located below the second electronic equipment 5, when the first electronic equipment 4 and the second electronic equipment 5 are fully held in the rack 2, rear ends of the first electronic equipment 4 and the second electronic equipment 5 are adjacent to a rear end of the rack 2. When the first electronic equipment 4 is withdrawn along sidewalls of the rack 2, the first fixing body 16 moves with the first electronic equipment 4, the first end of the first flexible body 13 fixed on the first fixing body 16 moves with the first fixing body 16, the first flexible body 13 is gradually fit along the supporting surface of the first supporting body 11, and the shape of the holding space which is formed by bending the first flexible body 13 to an arc shape and is used for holding the cable gradually changes. When the second electronic equipment 5 is withdrawn along sidewalls of the rack 2, the second fixing body 17 moves with the second electronic equipment 5, the second end of the second flexible body 15 fixed on the second fixing body 17 moves with the second fixing body 17, the second flexible body 15 is gradually fit along the supporting surface of the second supporting body 14, and the shape of the holding space which is formed by bending the second flexible body 15 to an arc shape and is used for holding the cable gradually changes.

Besides, as illustrated in FIG. 5 and FIG. 6, this embodiment further provides a rack-mounted equipment system, comprising an electronic equipment 3, a rack 2 and the above-mentioned cable management device 1, wherein the electronic equipment 3 is a server or a storage. In the rack-mounted equipment system, the number of the electronic equipment served by the cable management device 1 is one.

The rack 2 has an equipment holding space for holding the electronic equipment 3. Preferably, the rack 2 has a plurality of equipment holding spaces which are arranged in a stacked manner (in this embodiment, equipment holding spaces for holding the electronic equipment 3 and the cable management device 1 are only shown). The electronic equipment 3 is held in the equipment holding space in a withdrawable manner along sidewalls of the rack 2, and when the electronic equipment 3 is fully held in the rack 2, a rear end of the electronic equipment 3 is adjacent to a rear end of the rack 2.

Herein, the rack 2 comprises two sliding rails 21 which are respectively located on two sides of the electronic equipment 3 and four supporting columns 22 which support the two sliding rails 21, and the electronic equipment 3 is held in the equipment holding space in a withdrawable manner through the sliding rails 21.

The cable management device 1 is placed on the electronic equipment 3, wherein the fixing body 12 is adjacent to a rear end of the electronic equipment 3 and is fixed on an upper surface of the electronic equipment 3; and two ends of the supporting body are fixed on two of the supporting columns 22 which are connected with the same sliding rail 21.

In the rack-mounted equipment system, since the number of the electronic equipment 3 served by the cable management device 1 is one, the cable management device 1 may only comprise the first supporting body 11, the first flexible body 13 and the fixing body 12, and may also comprise the second supporting body 14 and the second flexible body 15 in addition to the first supporting body 11, the first flexible body 13 and the fixing body 12.

As illustrated in FIG. 7, this embodiment further provides a rack-mounted equipment system, comprising: a first electronic equipment 4, a second electronic equipment 5 located above the first electronic equipment 4, a rack having equipment holding spaces for holding the first electronic equipment 4 and the second electronic equipment 5, and the above-mentioned cable management device 1. Preferably, the rack 2 has a plurality of equipment holding spaces which are arranged in a stacked manner (in this embodiment, equipment holding spaces for holding the electronic equipment 3 and the cable management device 1 are only shown). The electronic equipment 4 and the second electronic equipment 5 are servers or memories. In the rack-mounted equipment system, the number of the electronic equipment 3 served by the cable management device 1 is two.

Herein, the first electronic equipment 4 and the second electronic equipment 5 are held in the equipment holding spaces in a withdrawable manner along sidewalls of the rack 2, and when the first electronic equipment 4 and the second electronic equipment 5 are fully held in the rack 2, rear ends of the first electronic equipment 4 and the second electronic equipment 5 are adjacent to a rear end of the rack 2.

The rack 2 comprises two sliding rails 21 which are respectively located on two sides of the first electronic equipment 4 and the second electronic equipment 5 and four supporting columns 22 which support the two sliding rails 21, and the first electronic equipment 4 and the second electronic equipment 5 are held in the equipment holding spaces in a withdrawable manner through the sliding rail 21.

In the rack-mounted equipment system, since the number of the electronic equipment served by the cable management device 1 is two, the cable management device 1 comprises the first supporting body 11, the first flexible body 13, the first fixing body 16, the second supporting body 14, the second flexible body 15 and the second fixing body 17.

At this moment, the cable management device 1 is located between the first electronic equipment 4 and the second electronic equipment 5, wherein the first fixing body 16 is adjacent to the rear end of the first electronic equipment 4 and is fixed on an upper surface of the first electronic equipment 4; the second fixing body 17 is adjacent to the rear end of the second electronic equipment 5 and is fixed on a lower surface of the second electronic equipment 5; and two ends of the first supporting body 11 and two ends of the second supporting body 14 are respectively fixed on two of the supporting columns 22 which are connected with the same sliding rail 21.

When the first electronic equipment 4 is withdrawn along sidewalls of the rack 2, the first fixing body 16 moves with the first electronic equipment 4, the first end of the first flexible body 13 fixed on the first fixing body 16 moves with the first fixing body 16, the first flexible body 13 is gradually fit along the supporting surface of the first supporting body 11, and the shape of the holding space which is formed by bending the first flexible body 13 to an arc shape and is used for holding the cable gradually changes; and when the second electronic equipment 5 is withdrawn along sidewalls of the rack 2, the second fixing body 17 moves with the second electronic equipment 5, the second end of the second flexible body 15 fixed on the second fixing body 17 moves with the second fixing body 17, the second flexible body 15 is gradually fit along the supporting surface of the second supporting body 14, and the shape of the holding space which is formed by bending the second flexible body 15 to an arc shape and is used for holding the cable gradually changes.

To sum up, according to the cable management device and the rack-mounted equipment system applying the cable management device provided by the present invention, by putting the entire cable management device on a case instead of behind the case, the length of the entire case can be reduced and the entire server or storage can be mounted in a shorter rack. In addition, the cable management device in the present invention can simultaneously serve upper and lower servers or memories, can also solely serve a lower server or storage, and is flexible and efficient to use. Therefore, the present invention effectively overcomes various disadvantages in the prior art and thus has a great industrial utilization value.

The above-mentioned embodiments are just used for exemplarily describing the principle and effects of the present invention instead of limiting the present invention.

One skilled in the art may make modifications or changes to the above-mentioned embodiments without going against the spirit and the range of the present invention. Therefore, all equivalent modifications or changes made by those who have common knowledge in the art without departing from the spirit and technical concept disclosed by the present invention shall be still covered by the claims of the present invention.

What is claimed is:

1. A cable management device for a rack-mounted equipment system comprising:
   a rack-mounted equipment system comprising a rack having an equipment holding space for holding electronic equipments which is withdrawable along sidewalls of the rack;
   a first supporting body used for fixing with the rack having a supporting surface used for supporting a first flexible body,
   a second supporting body used for fixing with the rack and has a supporting surface used for supporting a second flexible body, the second supporting body is parallel with the first supporting body;
   a fixing means used for fixing the first flexible body and second flexible body with the electronic equipment;
   the first flexible body has a first end and a second end, the first end of the first flexible body is fixed with the first supporting body, the second end of the first flexible body is fixed with the fixing means, the first flexible body is bent to an arc shape to form a holding space used for holding a cable, when the second end of the first flexible body moves with the fixing means, the first flexible body is fit with or deviated from the supporting surface of the first supporting body,
   the second flexible body has a first end and a second end, the first end of the second flexible body is fixed with the second supporting body, the second end of the second flexible body is fixed with the fixing means, the second flexible body is bent to an arc shape to form a holding space used for holding a cable, when the second end of the second flexible body moves with the fixing means, the second flexible body is fit with or deviated from the supporting surface of the second supporting body.

2. The cable management device according to claim 1, wherein, the first supporting body and second supporting body both are a sliding rail; and each of the first flexible body and second flexible body both is a drag chain which is capable to fit with the sliding rail as a drag chain unit.

3. The cable management device according to claim 2, wherein, the drag chain units comprises a first unit connecting part and a second unit connecting part which are connected with other drag chain unit, and a unit holding space is formed between the first unit connecting part and the second connecting part, wherein when the drag chain unit is connected with the other drag chain unit, the unit holding space of the drag chain unit is communicated with the unit holding spaces of the other drag chain units, and all drag chain units are rotatably connected with one another.

4. The cable management device according to claim 1, wherein, the electronic equipments comprises a first electronic equipment and a second electronic equipment, and the fixing means comprises a first fixing body which is used for fixing with an upper surface of the first electronic equipment and a second fixing body which is used for fixing with a lower surface of the second electronic equipment; the second end of the first flexible body is fixed with the first fixing body and the second end of the second flexible body is fixed with the second fixing body.

5. A rack-mounted equipment system, comprising:
   a first electronic equipment, a second electronic equipment located above the first electronic equipment, a rack having equipment holding spaces for holding the first electronic equipment and the second electronic equipment, and the cable management device of claim 4;
   the first electronic equipment and the second electronic equipment are held in the equipment holding spaces in a withdrawable manner along sidewalls of the rack, and when the first electronic equipment and the second electronic equipment are fully held in the rack, rear ends of the first electronic equipment and the second electronic equipment are adjacent to a rear end of the rack;
   the rack comprises two sliding rails which are respectively located on two sides of the first electronic equipment and the second electronic equipment and four supporting columns which support the two sliding rails, the first electronic equipment and the second electronic equipment are held in the equipment holding spaces in a withdrawable manner through the sliding rail;
   the cable management device of claim 4 is located between the first electronic equipment and the second electronic equipment, wherein:
   the first fixing body is adjacent to the rear end of the first electronic equipment and is fixed on an upper surface of the first electronic equipment; the second fixing body is adjacent to the rear end of the second electronic equipment and is fixed on a lower surface of the second electronic equipment; and
   two ends of the first supporting body and two ends of the second supporting body are respectively fixed on two of the supporting columns which are connected with the same sliding rail.

* * * * *